US006096484A

United States Patent [19]

Azuma

[11] Patent Number: 6,096,484

[45] **Date of Patent: *Aug. 1, 2000**

[54] PATTERN FORMING METHOD USING CHEMICALLY AMPLIFIED RESIST AND APPARATUS FOR TREATING CHEMICALLY AMPLIFIED RESIST

[75] Inventor: Tsukasa Azuma, Tokyo, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/951,112

[22] Filed: Oct. 15, 1997

[51] Int. Cl.[7] .......... G03F 7/26

[52] U.S. Cl. .......... 430/325; 430/322

[58] Field of Search .......... 430/270.1, 311, 430/322, 324, 325, 330, 961

[56] References Cited

U.S. PATENT DOCUMENTS 4,921,778 5/1990 Thackeray et al. .......... 430/326
5,079,131 1/1992 Thackeray et al. .......... 430/326
5,108,875 4/1992 Thackeray et al. .......... 430/326
5,326,675 7/1994 Niki et al. .......... 430/326
5,366,852 11/1994 Pavelchek et al. .......... 430/326
5,380,609 1/1995 Fujita et al. .......... 430/5
5,407,786 4/1995 Ito et al. .......... 430/313
5,429,910 7/1995 Hanawa .......... 430/313
5,631,314 5/1997 Wakiya .......... 524/165

OTHER PUBLICATIONS

Azuma et al., "The Role of the Residual Solvent for Chemical Amplification Resists," Journal of the Electrochemical Society, vol. 140, No. 11, Nov., 1993, pp. 3158–3161.

*Primary Examiner*—Kathleen Duda
*Attorney, Agent, or Firm*—Banner & Witcoff, Ltd.

[57] ABSTRACT

A chemically amplified resist is applied to a semiconductor substrate and subjected to post-apply bake, and exposed to light, then, the resist is treated with a vapor of an organic solvent such as PGMEA. By treating with the vapor of the organic solvent, acid diffusion in the resist in the post-exposure bake is suppressed, and a resist pattern having an excellent profile is obtained by development.

13 Claims, 3 Drawing Sheets

PATTERN FORMING METHOD USING CHEMICALLY AMPLIFIED RESIST AND APPARATUS FOR TREATING CHEMICALLY AMPLIFIED RESIST

BACKGROUND OF THE INVENTION

The present invention relates to a method for improving an abnormal profile for example, T-topping and top rounding, of a chemically amplified resist due to influence of contaminants in the air.

Recently, lithography using a chemically amplified resist is adopted for forming a fine pattern of a semiconductor device. However, in the lithography using the chemically amplified resist, there is a serious problem that a predetermined pattern width can not be obtained because of an abnormal profile after development, for example, T-topping and top rounding. The abnormal profile of the chemically amplified resist is caused by the following reasons.

When a chemically amplified resist is applied to a semiconductor substrate and subjected to post-apply bake (PAB), and then exposed to light, an acid generates from an acid generator contained in the chemically amplified resist. However, if contaminants exist in the air, the acid concentration in the resist varies during post-exposure bake (PEB) conducted subsequently. As a result, when the resist is developed, a resist pattern having an abnormal profile is formed.

Namely, if basic contaminants such as an amine exist in the air, the acid concentration near the surface of the resist decreases due to a neutralization reaction. Since the exposed regions where the acid concentration has decreased are not easily dissolved in a developing solution, T-topping occurs.

On the other hand, if acidic contaminants exist in the air, the acid concentration near the surface of the resist increases. Since the exposed regions and their neighboring regions where the acid concentration has increased are easily dissolved in a developing solution, top rounding occurs.

The following method is conventionally known to improve an abnormal profile of a chemically amplified resist. For example, Hanawa (U.S. Pat. No. 5,429,910) discloses a method of treating the surface of the resist after exposed to light with a solution or vapor of sulfuric acid or carboxylic acid. However, if the surface of the resist is treated with acid, it is difficult to control the acid concentration in the exposed region of the resist. Therefore, this method is not regarded as an effective method for improving the resist profile after development.

BRIEF SUMMARY OF THE INVENTION

The object of the present invention is to provide a method and an apparatus which can successfully improve an abnormal profile of a chemically amplified resist due to influence of contaminants in the air.

A pattern forming method of the present invention comprises steps of: coating an article to be treated, for example, a semiconductor substrate, with a chemically amplified resist and subjecting the resist to post-apply bake; exposing the resist to light; treating the resist with a vapor of an organic solvent; subjecting the resist to post-exposure bake; and developing the resist to form a resist pattern.

An apparatus for treating a chemically amplified resist of the present invention comprises a chamber for setting an article to be treated coated with a chemically amplified resist and a means for supplying a vapor of an organic solvent into the chamber.

Additional objects and advantages of the invention will be set forth in the description which follows, and in part will be obvious from the description, or may be learned by practice of the invention. The objects and advantages of the invention may be realized and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
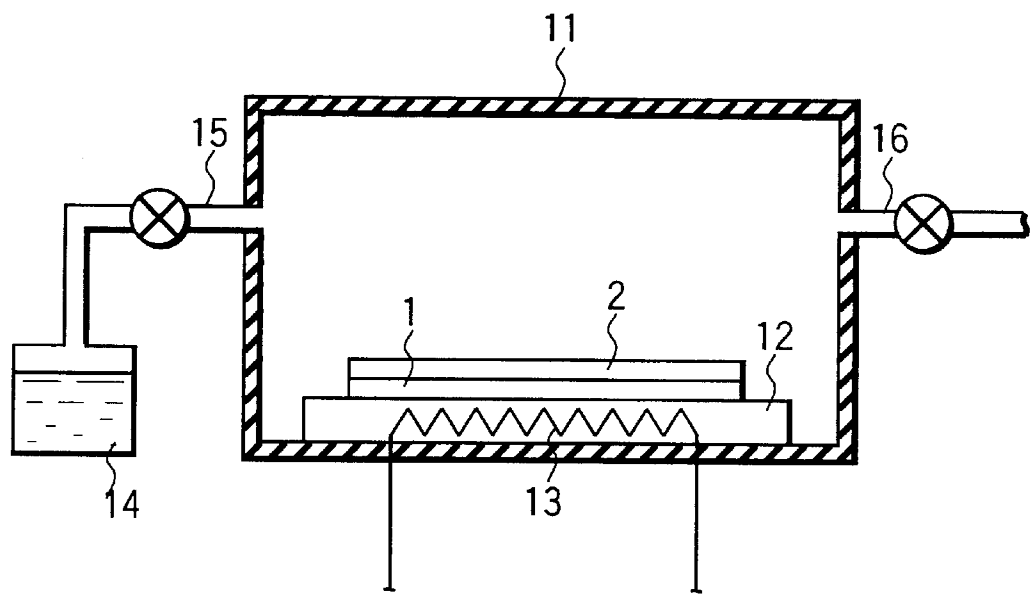
FIG. 1 shows an apparatus of the present invention for treating a chemically amplified resist.

The concentration of an acid in the exposed region of a chemically amplified resist can be successfully controlled if the chemically amplified resist after exposed to light is treated with a vapor of an organic solvent before conducting post-exposure bake (PEB) according to the method of the present invention. In the method of the present invention, acid diffusion in the resist in PEB step is controlled by treating the resist in advance with the vapor of the organic solvent. The principle of the present invention will be described below.

When a coating solution of a chemically amplified resist is applied to an article to be treated, for example, a semiconductor substrate, and the resist is subjected to post-apply bake (PAB), the amount of the solvent remaining in the resist decreases. When the chemically amplified resist is exposed to light, an acid generates from an acid generator contained in the resist. The amount of the solvent remaining in the resist influences acid diffusion in PEB step, and thus influences a resist profile after development. On the other hand, when the resist is treated with a solvent vapor, the amount of the solvent remaining in the resist recovers completely to that of the initial condition. Namely, change in the amount of the solvent remaining in the resist is a reversible process (see T. Azuma et al., J. Electrochem. Soc., 140, 3158 (1993)).

In the present invention, by solvent vapor treatment before PEB step, acid diffusion in PEB step can be controlled and a resist pattern having an excellent profile can be formed by development.

When T-topping of a resist is to be solved, vapor treatment is conducted using an organic solvent which can promote diffusion of the acid existing near the surface of the resist. In this case, the organic solvent used for the vapor treatment is preferably a solvent used in preparing the coating solution of a chemically amplified resist. For example, the vapor treatment is conducted using propylene glycol monomethyl ether acetate (PGMEA), methyl 3-methoxypropionate (MMP), ethyl lactate or ethyl 3-ethoxypropionate (EEP).

When top rounding is to be solved, it is preferable to conduct the vapor treatment using an organic solvent which can suppress diffusion of the acid existing near the surface of the resist in PEB step. In this case, the examples of the organic solvent used for the vapor treatment include 4-phenylpyridine or pyridine.

The conditions of the vapor treatment preferably ranges from ambient temperature to 160° C. and for 60 seconds to 10 minutes. If the treating temperature is low and the treating time is short, it is difficult to control acid diffusion in the surface region of a resist in PEB step. If the treating temperature is too high, the resist itself degrades, and if the treating time is too long, the effect of improving acid diffusion does not increase so much.

In the present invention, for treating a chemically amplified resist with an organic solvent vapor, there is used an apparatus comprising a chamber for setting an article to be treated coated with a chemically amplified resist and a means for supplying a vapor of an organic solvent into the chamber. It is preferable that this apparatus has a thermostat. A baker equipped with a nozzle for introducing the organic solvent vapor may also be used. Using such an apparatus, the vapor treatment is conducted under suitable conditions.

Further, to determine the conditions of the vapor treatment more strictly, it is preferable to measure in advance the amount of the organic solvent in the resist. For example, the amount of the organic solvent can be determined by measuring infra-red absorption of carbonyl group and ether bond in the organic solvent.

For measuring the amount of the organic solvent in the resist, it is desirable that the solvent vapor treating apparatus is equipped with a light source for irradiating the resist with light, a spectrometer for measuring absorption spectrum of the resist, for example, a Fourier transform infra-red spectrometer, and an analyzer for analyzing concentration of the organic solvent in the resist based on the absorption spectrum.

The present invention will be described more specifically below referring to drawings.

First, an apparatus for treating a chemically amplified resist is described referring to FIG. 1. A supporter 12 is installed in a chamber 11, and the supporter 12 is provided with a heater 13. A silicon wafer 1 coated with a chemically amplified resist 2 is placed on the supporter 12. A solvent vapor is supplied into the chamber 11 through supplying pipe 15 from a solvent vessel 14, and the solvent vapor is discharged from a discharging pipe 16.

Figure 2:
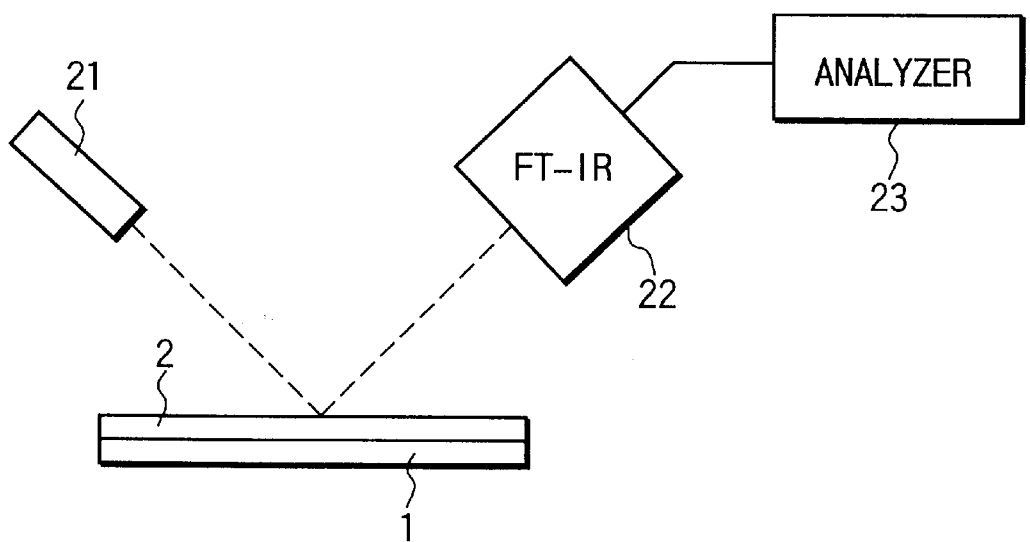
FIG. 2 shows an apparatus of the present invention for measuring the amount of an organic solvent in a chemically amplified resist.

The treating apparatus may be equipped with a mechanism for measuring the amount of an organic solvent in the resist. Such a mechanism is described referring to FIG. 2. Light is irradiated from a light source 21 onto the chemically amplified resist 2 on the silicon wafer 1, infra-red absorption spectrum of the resist 2 is measured by a Fourier transform infra-red spectrometer 22, and the concentration of the organic solvent in the resist 2 is analyzed by an analyzer 23 based on this spectrum.

Figure 3A:
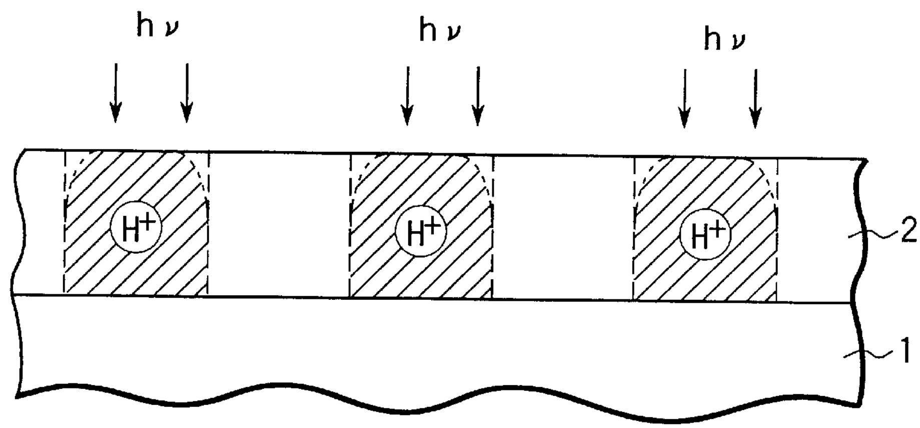
FIGS. 3A to 3C show an example of steps of the pattern forming method of the present invention.
Figure 3B:
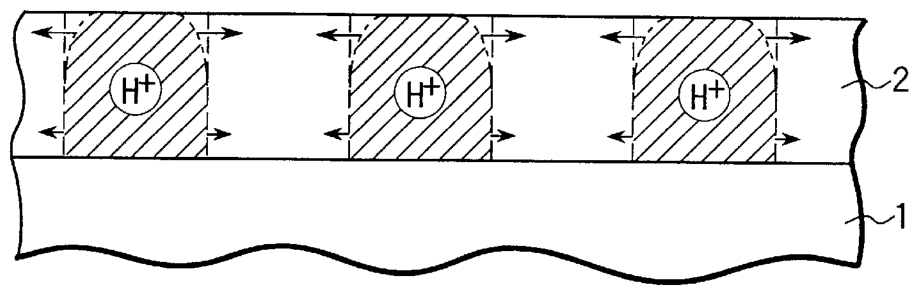

A method for solving T-topping of a chemically amplified resist is specifically described below referring to FIGS. 3A to 3C.

First, a solution of APEX-E (manufactured by Shipley) as a chemically amplified positive resist 2 is applied to the silicon wafer 1, then the resist is subjected to post-apply bake (PAB). Owing to PAB, the amount of the solvent remaining in the resist decreases. Then, the resist is exposed to light through a mask to form a latent image. In the exposed region of the resist, an acid generates from an acid generator contained in the resist. In this procedure, if basic contaminants such as an amine exist in the atmosphere, acid concentration on the surface of the exposed region of the resist 2 decreases as shown in FIG. 3A.

Next, the resist 2 is treated with a vapor of propylene glycol monomethyl ether acetate (PGMEA), for example, at 23° C. for 60 seconds, using the apparatus shown in FIG. 1. As a result, the solvent concentration in the surface region of the resist 2 increases than that of the initial condition. Then, when post-exposure bake (PEB) is conducted, acid diffusion is promoted in the surface region of the resist 2 as shown in FIG. 3B, however, acid diffusion remains in ordinary condition in the region of the resist 2 near wafer 1.

Figure 3C:
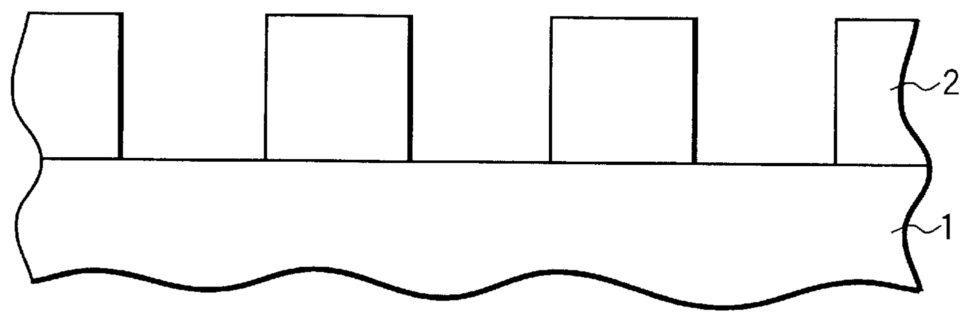

If development is conducted in this condition, there can be formed a resist pattern having an excellent profile as shown in FIG. 3C.

Figure 4A:
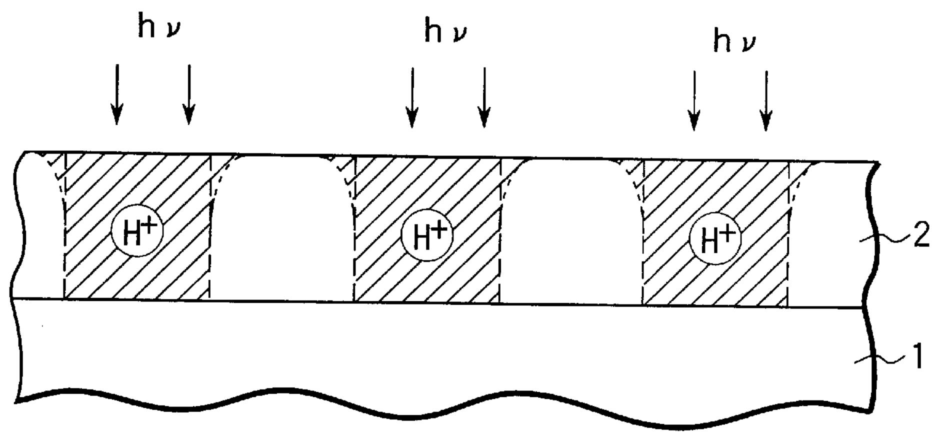
FIGS. 4A to 4C show another example of steps of the pattern forming method of the present invention.
Figure 4B:
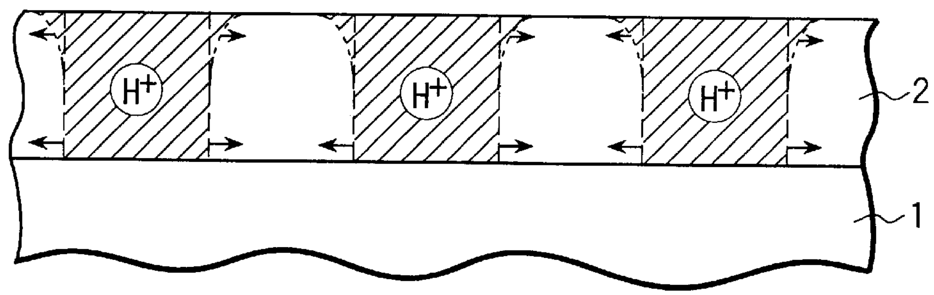

Further, a method for solving top rounding of a chemically amplified resist is specifically described below referring to FIGS. 4A to 4C.

First, a solution of UV2HS (manufactured by Shipley) as a chemically amplified positive resist 2 is applied to the silicon wafer 1, then the resist is subjected to post-apply bake (PAB). Owing to PAB, the amount of the solvent remaining in the resist decreases. Then, the resist is exposed to light through a mask to form a latent image. In the exposed region of the resist, an acid generates from an acid generator contained in the resist. In this procedure, if acidic contaminants exist in the atmosphere, acid concentration on the surface of the exposed region of the resist 2 increases as shown in FIG. 4A.

Next, the resist 2 is treated with a vapor of pyridine, for example, at 100° C. for 60 seconds, using the apparatus shown in FIG. 1. Then, when post-exposure bake (PEB) is conducted, acid diffusion is suppressed in the surface region of the resist 2 as shown in FIG. 4B, however, acid diffusion remains in ordinary condition in the region of the resist 2 near wafer 1.

Figure 4C:
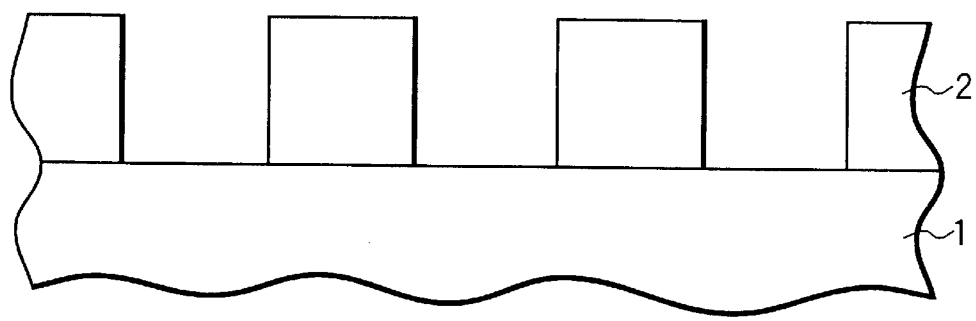

If development is conducted in this condition, there can be formed a resist pattern having an excellent profile as shown in FIG. 4C.

Additional advantages and modifications will readily occur to those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A pattern forming method using a chemically amplified resist comprising the steps of:

coating an article to be treated with a chemically amplified resist, the chemically amplified resist including an acid generator, and subjecting the resist to post-apply bake;

exposing the resist to light;

treating the exposed resist with a vapor of an organic solvent, where the organic solvent is selected depending on an acidity of an atmosphere in which the resist is located, and wherein the organic solvent either promotes or suppresses diffusion into the resist of an acid generated by the acid generator;

subjecting the treated resist to post-exposure bake; and developing the post-exposure baked resist to form a resist pattern.

2. The method according to claim 1, wherein the chemically amplified resist is a positive resist.

3. A pattern forming method using a chemically amplified resist while preventing T-topping of the resist where basic contaminants exist in air, comprising the steps of:

coating an article to be treated with a chemically amplified resist and subjecting the resist to post-apply bake;

exposing the resist to light;

treating the exposed resist with a vapor of an organic solvent;

subjecting the treated resist to post-exposure bake; and developing the post-exposure baked resist to form a resist pattern, wherein the organic solvent serves to promote diffusion into the resist of an acid near the surface of the resist in the post-exposure bake, and the acid is generated by an acid generator included in the resist.

4. A pattern forming method using a chemically amplified resist comprising the steps of:

coating an article to be treated with a chemically amplified resist, the chemically amplified resist including an acid generator, and subjecting the resist to post-apply bake;

exposing the resist to light;

treating the exposed resist with a vapor of an organic solvent, where the organic solvent is selected depending on an acidity of an atmosphere in which the resist is located, and wherein the organic solvent either promotes or suppresses diffusion into the resist of an acid generated by the acid generator;

subjecting the treated resist to post-exposure bake; and developing the post-exposure baked resist to form a resist pattern, wherein the organic solvent is a solvent for dissolving the resist.

5. The method according to claim 3, wherein the organic solvent is propylene glycol monomethyl ether acetate, methyl 3-methoxypropionate, ethyl lactate or ethyl 3-ethylpropionate.

6. The method according to claim 4, wherein the amount of the organic solvent in the resist is measured before the resist is treated with the vapor of the organic solvent.

7. The method according to claim 4, wherein the treatment with the vapor of the organic solvent is conducted in a range from ambient temperature to 160° C. for 60 seconds to 10 minutes.

8. The method according to claim 4, wherein the vapor of the organic solvent serves to increase a concentration of the acid existing near the surface of the resist.

9. A pattern forming method using a chemically amplified resist while preventing top-rounding of the resist where acidic contaminants exist in air, comprising the steps of:

coating an article to be treated with a chemically amplified resist and subjecting the resist to post-apply bake;

exposing the resist to light;

treating the exposed resist with a vapor of a basic organic solvent;

subjecting the treated resist to post-exposure bake; and developing the post-exposure baked resist to form a resist pattern, wherein the organic solvent serves to suppress diffusion into the resist of an acid near the surface of the resist in the post-exposure bake.

10. The method according to claim 9, wherein the organic solvent is 4-phenylpyridine or pyridine.

11. The method according to claim 9, wherein the vapor of the organic solvent serves to reduce a concentration of the acid existing near the surface of the resist.

12. The method of claim 9, wherein said acid is generated by an acid generator included in the resist.

13. The method according to claim 9, wherein the treatment with the vapor of the organic solvent is conducted in a range from ambient temperature to 160° C. for 60 seconds to 10 minutes.

* * * * *